United States Patent [19]

Morishita et al.

[11] Patent Number: 4,510,226
[45] Date of Patent: Apr. 9, 1985

[54] PHOTOSENSITIVE COMPOSITION AND PATTERN FORMING PROCESS USING SAME

[75] Inventors: Hajime Morishita; Motoo Akagi; Saburo Nonogaki, all of Tokyo; Nobuaki Hayashi, Saitama; Shoichi Uchino, Hachioji, all of Japan

[73] Assignee: Hitachi, Ltd., Tokyo, Japan

[21] Appl. No.: 515,191

[22] Filed: Jul. 19, 1983

[30] Foreign Application Priority Data

Aug. 11, 1982 [JP] Japan .................................. 57-138534

[51] Int. Cl.³ .............................................. G03C 1/58
[52] U.S. Cl. ..................................... 430/144; 430/172
[58] Field of Search ................................ 430/172, 144

[56] References Cited

U.S. PATENT DOCUMENTS 4,377,630  3/1983  Morishita et al. .................... 430/144

FOREIGN PATENT DOCUMENTS 1103865  2/1968  United Kingdom .

*Primary Examiner*—Won H. Louie
*Attorney, Agent, or Firm*—Antonelli, Terry & Wands

[57] ABSTRACT

A photosensitive composition becoming sticky upon exposure to light which comprises (a) a salt of a diazonium compound represented by the formula

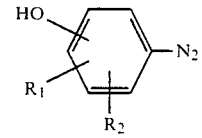

wherein $R_1$ and $R_2$ are independently —H, —CH$_3$, —OCH$_3$ or

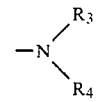

but $R_1$ and $R_2$ cannot be

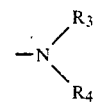

at the same time; and $R_3$ and $R_4$ are independently a straight-chain lower alkyl group, and (b) a salt of an aromatic diazonium compound having no —OH group directly bonding to a benzene ring, has an improved sensitivity because it contains the salt of the compound represented by the above formula. By using said photosensitive composition, there is provided a process for forming a pattern of powder coated layer excellent in light sensitivity.

11 Claims, No Drawings

PHOTOSENSITIVE COMPOSITION AND PATTERN FORMING PROCESS USING SAME

BACKGROUND OF THE INVENTION

This invention relates to a photosensitive composition and a pattern forming process using such a composition.

The interior side of the face plate of a color picture tube is coated with three different kinds of phosphors in dots or in stripes. This phosphor coat layer is formed in the following way. First, a mixed coating material composed of a phosphor for the first color and a photosensitive resin is applied on the interior side of the face plate and dried to form a coating film. Then, this film layer is irradiated with ultraviolet rays through the holes of a shadow mask. The ultraviolet rays are irradiated to the position where the electron beams for effecting emmision of light from the phosphor hit, that is, the place where said phosphor is to be attached. The photosensitive resin at the irradiated portions is insolubilized, resulting in insolubilization of the entire layer in the portions. Then the layer is washed with a solvent, retaining the insolubilized portions alone on the face plate while removing the other portions of the layer by dissolution. Then the same operation is performed with the layer formed from a mixture of a phosphor for a second color and a photosensitive resin, and this is followed by the same operation by using a mixture of a phosphor for the third color and a photosensitive resin.

As appreciated from the foregoing explanation, the color picture tube phosphor surface forming process is complicated, and multiple times of repetition of wet coating, water washing and drying are required, so that simplification of such a process is quite desirable.

As an improvement on such process, some of the present inventors previously proposed, in Japanese Patent Application Kokai (Laid-Open) No. 126861/78, a method of forming a color picture tube phosphor surface in a considerably simpler manner than the prior art. This method was attained on the basis of a new finding that the photolytic product of an aromatic diazonium salt has an ability to accept powder particles, and it is characterized by (1) coating the inner surface of the face plate of a color picture tube with a photosensitive composition containing an aromatic diazonium salt as a photosensitive component capable of becoming sticky upon exposure to light, thereby forming a thin coating layer on said surface, (2) subjecting the thin layer to patternwise exposure to make the exposed portions sticky, and (3) contacting powder particles with the exposed thin layer to have the powder particles accepted by the thin layer.

According to this method, mere repetition of exposure and powder contact is required for the phosphors of the second and third colors, and when the coating film is once formed, it is possible to form as many phosphor patterns as desired. This method, however, has a drawback in that the processing time is rather long due to a somewhat lower sensitivity of the photosensitive component than conventional photosensitive resins.

To improve the situation, the present inventors previously proposed sensitizers for photosensitive compositions in Japanese Patent Application Kokai (Laid-Open) No. 17543/82. The sensitizers described in the invention shows some improvements in sensitivity.

As described in the above-mentioned Japanese Patent Application Kokai (laid-Open) No. 126861/78, if the coating film of a photosensitive composition is not crystallized, when a phosphor powder is contacted with the coating film, the powder adheres even to the nonexposed portions causing a so-called "fogging" phenomenon. The above-mentioned sensitizers are somewhat inferior in crystallinity when used in coating films. Further, when used in photosensitive compositions in large quantities, these sensitizers show increased sensitizing effects but the "fogging" phenomenon becomes more serious.

Thus, development of a sensitizer having a high sensitizing effect by addition of a small quantity or a sensitizer having excellent crystallinity by itself is desired.

SUMMARY OF THE INVENTION

Objects of this invention are to provide a highly sensitive composition used in a pattern forming process with the aromatic diazonium salt and a pattern forming process using this composition.

These and other objects of this invention can be attained by a photosensitive composition comprising (a) a salt of a diazonium compound represented by the formula:

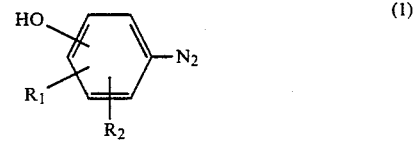

wherein $R_1$ and $R_2$ are independently H, —$CH_3$, —$OCH_3$ or

but $R_1$ and $R_2$ can not be

at the same time; and $R_3$ and $R_4$ are independently a straight-chain lower alkyl group, and (b) a salt of an aromatic diazonium compound having no —OH group directly bonding to a benzene ring, and by a pattern forming process using this composition.

DETAILED DESCRIPTION OF PREFERRED EMBODIMENTS

In the aforementioned general formula (1), the position of —OH group must be a m- or p-position relative to the position of diazonium group. In other words, the diazonium group and the —OH group are not at neighbouring positions (o-position) to each other.

As the salt of the compound represented by the aforementioned general formula (1) and the salt of the aromatic diazonium compound having no —OH group directly bonding to the benzene ring, there are exemplified chloride-zinc chloride double salts (Cl.1/2$ZnCl_2$ or Cl.$ZnCl_2$), borofluorides ($BF_4$), hydrogensulfates ($HSO_4$), etc. Among them, chloride-zinc chloride double salts of the diazonium compound of the formula (1)

and those of the aromatic diazonium compound are preferable. Reasons are as follows.

As described earlier, if the coating film of the photosensitive composition is not crystallized, when a phosphor powder is contacted with the film, the powder sometimes adheres even to the non-exposed portions of the film. Accordingly, the coating film must be crystallized. The use of a diazonium chloride-zinc chloride double salt as an aromatic diazonium salt is preferable, because this compound excels in crystallinity and further accepts a large quantity of a phosphor powder.

In the compound represented by the above general formula (1), $R_3$ and $R_4$ preferably are an alkyl group of 1 or 2 carbon atoms, because such a compound also excels in crystallinity. When $R_3$ and $R_4$ both are methyl groups, the compound of the general formula gives the best crystallinity.

The compound represented by the above general formula (1) includes, for example:

4-(Hydroxy)benzenediazonium chloride zinc chloride double salt

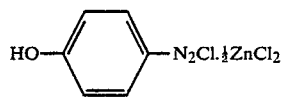

(2)

3-Hydroxy-4-(dimethylamino)benzenediazonium chloride zinc chloride double salt

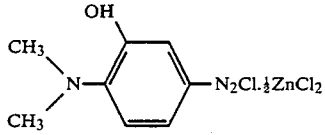

(3)

4-Hydroxy-3-(dimethylamino)benzenediazonium chloride zinc chloride double salt

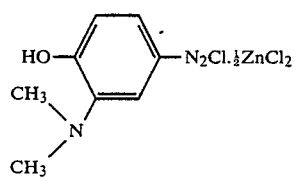

(4)

4-Hydroxy-2-(dimethylamino)benzenediazonium chloride zinc chloride double salt

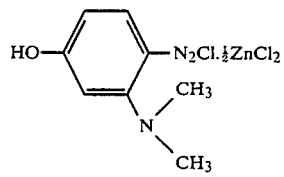

(5)

The diazonium compound of the formula (1) can be used alone or as a mixture thereof.

These compounds are highly sensitive but not particularly superior in crystallinity. Therefore, it is preferable that they are used together with salts of aromatic diazonium compounds having no —OH group directly bonding to the benzene ring. Salts of aromatic diazonium compounds having a —OH group but not directly bonding to the benzene ring, for example, salts of 4-(N-ethyl-N-hydroxyethylamino)benzenediazonium belong to the salts of aromatic diazonium compounds having no —OH group directly bonding to the benzene ring. The salts of aromatic diazonium compounds having no —OH group directly bonding to the benzene ring can be used alone or as a mixture thereof.

As the salt of the aromatic diazonium compound having no —OH group directly bonding to the benzene ring, there may be used compounds described in the aforementioned Japanese Patent Application Kokai (Laid-Open) No. 126861/78, and so forth. Examples of the compounds are aromatic diazonium chloride zinc chloride double salts such as 4-(dimethylamino)benzenediazonium chloride zinc chloride double salt, 4-(dimethylamino)benzenediazonium chloride zinc chloride double salt, 4-(N-ethyl-N-hydroxyethylamino)benzenediazonium chloride zinc chloride double salt, 4-methoxybenzenediazonium chloride zinc chloride double salt and the like; aromatic diazonium tetrafluoroborides such as 4-(dimethylamino)benzenediazonium borofluoride, 2-methoxybenzenediazonium borofluoride and the like; and aromatic diazonium hydrogensulfates such as 4-(dimethylamino)benzenediazonium sulfate, 4-(phenylamino)benzenediazonium sulfate and the like; 2-methyl-4-(dimethylamino)benzenediazonium chloride zinc chloride double salt, etc.

Among these salts, zinc chloride double salts are preferred for crystallizing the coating film as heretofore described. It is particularly preferable to use 4-(dimethylamino)benzenediazonium chloride zinc chloride double salt, and in the case of using two or more salts in admixture, it is desirable to add the 4-(dimethylamino)benzenediazonium zinc chloride double salt as one of the salts to be mixed.

The quantity of the salt of the diazonium compound represented by the formula (1) added is preferably in the range of 1 to 60% by weight, more preferably 2 to 50% by weight and most preferably 5 to 30% by weight based on the weight of all diazonium compound salts added. Addition of this salt in a quantity of 1% by weight or more shows sensitizing effect only slightly but the effect becomes clear by addition of the salt in a quantity of 2% or more. The effect becomes remarkable when the salt is added in a quantity of 5% by weight or more. When its addition quantity exceeds 50% by weight, the coating film tends to reduce crystallinity to some extent. When its addition quantity exceeds 60% by weight or more, the film reduces crystallinity further. When an organic polymer compound is added to the diazonium compound composition of this invention as described later, the crystallinity of the coating film is somewhat reduced by addition of the salt of the diazonium compound of the general formula (1) in a quantity of only 30% by weight or more.

It has been already proposed to blend an organic polymer compound and/or a surfactant in the photosensitive component for the purpose of improving coatability when forming a thin layer with the photosensitive component accordingly to this invention, and use of such blended photosensitive component is also desirable in this invention. The organic polymer compound recommendable for use in this invention for this purpose include gum arabic, polyvinyl alochol, polyacrylamide, poly(N-vinylpyrrolidone), hydroxypropylmethyl cellulose, alginic acid, propylene glycol esters of alginic acid, ` acrylamide-diacetoacrylamide copolymer and methylvinyl ether-maleic anhydride copolymer. These organic polymer compounds are preferably used in a quantity of 0.5% to 500% by weight, more preferably 0.5 to 100% by weight and most preferably 0.5 to 50% by weight, based on all diazonium compound salts. The surfactant is preferably used in a quantity of about 0.01 to 1% by weight.

In the present invention, a pattern is formed by applying a solution of the composition on a substrate, drying it to form a coating film, subjecting this coating film to exposure of a predetermined pattern to make the exposed portions sticky, then contacting the first powder with this coating film to attach the powder to the exposed portions, removing the rest of the powder by a suitable means such as air spray, and repeating the above process after exposure for the second and third powders. In this way, a high-sensitivity pattern of several different kinds of powders can be formed.

The powders used in this invention are those having a mean particle size of about 0.01 to 100 $\mu$m. In the case of using phosphors or pigment-coated phosphors, it is preferable to use powders having a mean particle size of about 4 to 15 $\mu$m.

That the thus formed phosphor coating layer can be fixed by contacting it with an alkaline material vapor such as ammonia gas is taught in the aforementioned Japanese Patent Application Kokai (Laid-Open) No. 126861/78 and other literatures, and such fixing procedures can be employed in this invention as well.

Hereinunder, this invention will be explained by referring to Examples. At first, the synthesis methods for compounds represented by the aforementioned general formula (1) are explained.

SYNTHESIS EXAMPLE 1

15 Grams of p-aminophenol was dissolved in a mixture of 35 ml of concentrated hydrochloric acid (36%) and 30 ml of water. To the resulting mixture being cooled at 0° to 1° C., a 30% aqueous sodium nitrite solution was added dropwise to complete diazotization. Then, 50% zinc chloride solution was poured therein to form a double salt with zinc chloride. The double salt was recrystallized from an acidic 5% zinc chloride solution to obtain the compound of the formula (2).

SYNTHESIS EXAMPLE 2

50 Grams of 2-methoxy-4-nitroaniline was reacted with 200 ml of dimethyl sulfate for 30 minutes at 100° C. After allowing to cool, the reaction mixture was treated with a 30% aqueous sodium hydroxide solution to obtain 2-methoxy-4-nitro-N,N-dimethylaniline. Then, this compound was subjected to a reaction with $AlCl_3$ in benzene for 4 to 5 hours at 50° C. to phenolize the methoxy group to obtain 2-hydroxy-4-nitro-N,N-dimethylaniline. After reduction of this compound, diazotization was conducted in the same manner as in Synthesis Example 1 and thereafter zinc chloride was added to obtain the compound of the formula (3).

SYNTHESIS EXAMPLE 3

The methoxy group of 2-methoxy-5-nitroso-N,N-dimethylaniline was converted to a phenol group in a similar manner to the one described in Synthesis Example 2. After reduction and diazotization, the compound of the formula (4) was obtained.

EXAMPLE 1

4-(Hydroxy)benzenediazonium chloride zinc chloride double salt of the formula (2) and 4-(dimethylamino)benzenediazonium chloride zinc chloride double salt were mixed in a weight ratio of 1 to 9. Thereto was added an aqueous solution containing 5% of propylene glycol alginate so that its solid portion became 10% by weight based on the weight of the sum of the diazonium compounds. The resulting mixture was coated on a glass substrate by a spin coating method. The coated material was dried to obtain a crystallized film having a thickness of about 0.5 $\mu$m. The film was subjected to light exposure for 160 sec through a shadow mask at a distance of 135 cm from a 500 W super-high pressure mercury arc lamp. A phosphor powder was contacted with the light-exposed film, whereby the phosphor powder adhered to the exposed portions of the film. For comparison, using only 4-(dimethylamino)benzenediazonium chloride zinc chloride double salt and propylene glycol alginate and not using the compound of the formula (2), a similar procedure was conducted. In order to attach about the same quantity of the phosphor, the irradiation time of 250 sec was necessary.

By repeating the above exposure and phosphor contact two more times, a phosphor surface to which three kinds of phosphors adhered could be obtained.

EXAMPLE 2

Using 0.5 part by weight of the diazonium salt of the formula (2), 0.5 part by weight of the diazonium compound of the formula (4) and 9 parts by weight of 4-(dimethylamino)benzenediazonium chloride zinc chloride double salt, an experiment similar to Example 1 was conducted. In order to attach about the same quantity of a phosphor, the irradiation time of 140 sec was necessary.

SYNTHESIS EXAMPLE 4

Synthesis of p-diazo-2,6-dimethylphenol chloride zinc chloride double salt

25 Grams of 2,6-dimethylphenol was dissolved in 246 ml of 50% aqueous glacial acetic acid solution. To this solution being kept at 15° C. or lower was added dropwise 91 g of 30% aqueous sodium nitrite solution, whereby 2,6-dimethyl-p-nitrosophenol was obtained. The compound was reduced to be converted to an amino compound. The amino compound was subjected to diazotization at 0° to 2° C. Into the resulting reaction mixture was poured a 50% aqueous zinc chloride solution. By thorough mixing, a double salt of a diazonium salt with zinc chloride was deposited. Infrared absorption spectra (KBr tablet method): around 3300 $cm^{-1}$, 2200 $cm^{-1}$, 1570 $cm^{-1}$, 1080 $cm^{-1}$, 930 $cm^{-1}$; ultraviolet absorption spectra (solvent: water), wavelength at maximum absorption: 364 nm.

SYNTHESIS EXAMPLES 5 AND 6

Synthesis of p-diazo-2,5-dimethylphenol chloride zinc chloride double salt

Using 2,5-dimethylphenol as a raw material, the captioned compound was synthesized in the same manner as in Synthesis Example 4.

Synthesis of p-diazo-3,5-dimethylphenol chloride zinc chloride double salt

25 Grams of 3,5-dimethylphenol was dissolved in 200 g of 5% aqueous sodium hydroxide solution. Therein were dissolved 1 g of hypo and 20 g of sodium nitrite. To this solution being kept at 7° C. or lower was added dropwise a solution of 27 ml of concentrated sulfuric acid dissolved in 80 ml of water, whereby 4-nitroso-3,5-dimethylphenol was deposited. Thereafter, the same procedure as in Synthesis Example 4 was conducted to obtain the captioned double salt.

EXAMPLE 3

1 Part by weight of p-diazo-2,6-dimethylphenol chloride zinc chloride double salt and 9 parts by weight of p-diazo-N,N-dimethylaniline chloride zinc chloride double salt were mixed. Thereto was added an aqueous solution containing 0.5% of propylene glycol alginate so that its solid content became 10% by weight based on the weight of the sum of the diazonium compounds. The resulting mixture was coated on a glass substrate by the spin coating method. The coated substrate was dried to obtain a crystallized film having a thickness of about 0.5 μm. The film was subjected to light exposure for 150 sec through a shadow mask at a distance of 135 cm from a 500 W super-high pressure mercury arc lamp. A phosphor powder was contacted with the exposed film, whereby the phosphor powder adhered to the exposed portions of the film. Incidentally, also when p-diazo-3,5-dimethylphenol chloride zinc chloride double salt was used, about the same result was obtained. For comparison, using only p-diazo-N,N-dimethylaniline chloride zinc chloride double salt and propylene glycol alginate, a similar procedure was conducted. In order to attach about the same quantity of the phosphor, the irradiation time of 250 sec was necessary.

EXAMPLE 4

Synthesis of p-diazo-o-methoxyphenol chloride zinc chloride double salt

Using o-methoxyphenol as a raw material, the captioned compound was synthesized in accordance with the same procedure as in Synthesis Example 1. Then, 1 part by weight of this double salt and 9 parts by weight of p-diazo-N,N-dimethylaniline chloride zinc chloride double salt were mixed. Thereto was added an aqueous solution containing 0.5% of propylene glycol alginate so that its solid content became 10% by weight based on the weight of the sum of the diazonium compounds. This mixture was coated on a glass plate in the same manner as described in Example 3, whereby a film having a thickness of 0.5 μm was formed. The film was subjected to light exposure in the same manner as described in Example 3. The irradiation time required for attaching a sufficient quantity of a phosphor was 160 sec.

What is claimed is:

1. A process for forming a pattern of a powder coating layer which comprises:
    a step of coating a substrate with a photosensitive composition comprising (a) at least one salt of a diazonium compound of the formula:

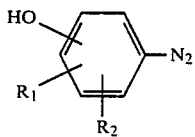

wherein $R_1$ and $R_2$ are independently —H, —CH$_3$, —OCH$_3$ or

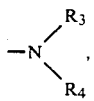

but $R_1$ and $R_2$ cannot be

at the same time; and $R_3$ and $R_4$ are independently a straight-chain lower alkyl group, and (b) at least one salt of an aromatic diazonium compound having no —OH group directly bonding to a benzene ring, to form a thin coating layer on said substrate, the amount of the diazonium compound salt (a) in said photosensitive composition being 1 to 60% by weight based on the total weight of the diazonium compound salts (a) and (b);
    a step of imagewisely exposing said thin coating layer to light to make the exposed portions of the film sticky; and
    a step of contacting phosphor powder particles with the exposed thin coating layer to adhere the powder particles to the exposed portions.

2. A process for forming a pattern according to claim 1, wherein the amount of the diazonium compound salt (a) is 2 to 50% by weight based on the total weight of the diazonium compound salts (a) and (b).

3. A process for forming a pattern according to claim 1, wherein the salt of the compound represented by the formula is a chloride zinc chloride double salt.

4. A process for forming a pattern according to claim 1, wherein the salt of the aromatic diazonium compound having no —OH group directly bonding to a benzene ring is a chloride zinc chloride double salt.

5. A process for forming a pattern according to claim 1, wherein said photosensitive composition further comprises an organic polymer compound in a quantity of 0.5 to 500% by weight based on the total weight of the diazonium compound salts (a) and (b).

6. A process for forming a pattern according to claim 1, wherein the amount of the diazonium compound salt (a) is 5 to 30% by weight based on the total amount of the diazonium compound salts (a) and (b).

7. A process for forming a pattern according to claim 1 wherein the phosphorus powder particles have a mean particle size of about 0.01 to 100 μm.

8. A process for forming a pattern according to claim 1, wherein said at least one salt (a) is selected from the group consisting of 4-(hydroxy)benzene diazonium chloride zinc chloride double salt, 3-hydroxy-4-(dimethylamino)benzene diazonium chloride zinc chloride double salt, 4-hydroxy-3-(dimethylamino)benzene diazonium chloride zinc chloride double salt, and 4-hydroxy-2-(dimethylamino)benzine diazonium chloride zinc chloride double salt.

9. A process for forming a pattern according to claim 8, wherein said at least diazonium compound salt (b) is selected from the group consisting of 4-(dimethylamino)benzenediazonium chloride zinc chloride double salt, 4-(N-ethyl-N-hydroxyethylamino)benzenediazonium chloride zinc chloride double salt, 4-methoxybenzenediazonium chloride zinc chloride double salt, 4-(dimethylamino)benzenediazonium borofluoride, 2-methoxybenzenediazonium borofluoride 4-(dimethylamino)benzenediazonium sulfate, 4-(phenylamino)benzenediazonium sulfate and 2-methyl-4-(dimethylamino)benzenediazonium chloride zinc chloride double salt.

10. A process for forming a pattern according to claim 1 wherein $R_3$ and $R_4$ are independently an alkyl group containing 1 or 2 carbon atoms.

11. A process for forming a pattern according to claim 1, wherein $R_3$ and $R_4$ are independently a methyl group.

* * * * *